(12) United States Patent
Topliss et al.

(10) Patent No.: US 7,166,952 B2
(45) Date of Patent: Jan. 23, 2007

(54) PIEZOELECTRIC STRUCTURES

(75) Inventors: Richard Topliss, Cambridge (GB); David Livingstone, Hertfordshire (GB); Andrew Matheson, Belmont, MA (US); Gareth McKevitt, Cambridge (GB); Mark Richard Shepherd, Hertfordshire (GB); Anthony Hooley, Cambridge (GB)

(73) Assignee: 1... Limited, Cambridge (GB)

( * ) Notice: Subject to any disclaimer, the term of this patent is extended or adjusted under 35 U.S.C. 154(b) by 3 days.

(21) Appl. No.: 10/491,220

(22) PCT Filed: Sep. 26, 2002

(86) PCT No.: PCT/GB02/04370

§ 371 (c)(1),
(2), (4) Date: Sep. 16, 2004

(87) PCT Pub. No.: WO03/028122

PCT Pub. Date: Apr. 3, 2003

(65) Prior Publication Data

US 2005/0040736 A1  Feb. 24, 2005

(30) Foreign Application Priority Data

Sep. 27, 2001  (GB) ................................. 0123294.1

(51) Int. Cl.
*H01L 41/08* (2006.01)

(52) U.S. Cl. ...................... 310/330; 310/367; 310/368; 310/369

(58) Field of Classification Search ................ 310/328, 310/330–332, 367–369
See application file for complete search history.

(56) References Cited

U.S. PATENT DOCUMENTS 3,816,774 A * 6/1974 Ohnuki et al. .............. 310/332

(Continued)

FOREIGN PATENT DOCUMENTS

JP  56-01269 A  2/1981

(Continued)

OTHER PUBLICATIONS

J.K. Lee & M.W Csontos; "Multilayered piezoelectric flexure device"; Nov. 1979; pp. 627-628; vol. 187, Nr. 15; Research Disclosures, Kenneth Mason Publications; Hampshire, United Kingdom.

*Primary Examiner*—Mark Budd
(74) *Attorney, Agent, or Firm*—Elman Technology Law, P.C.; Gerry J. Elman

(57) ABSTRACT

An equivalent to the spatial separation either side of a nominal median plane that is inherent in a bimorph (with one piezoelectric layer on one side, and the second on the other side of the plane) is attained by structurally shaping the cross-section of a simple, single piezoelectric layer (11) such that it has a multiplicity of piezoelectric portions arranged in two generally-planar groups one either side of a median plane, so that any dimension change undergone by a portion on one side of that plane will tend to bend the whole device in the opposite direction to the same sense dimension change undergone by a portion on the other side of that plane. The simple, single layer acts as though it were a bimorph if elongate and beam-like, bending along its length, one end moving up/down, or back/forth, relative to the other but with any need for an internal, electrode.

19 Claims, 8 Drawing Sheets

U.S. PATENT DOCUMENTS

| | | | |
|---|---|---|---|
| 4,028,566 A | 6/1977 | Franssen et al. | |
| 4,056,742 A * | 11/1977 | Tibbetts | 310/357 |
| 5,410,207 A | 4/1995 | Miura et al. | |
| 5,633,554 A * | 5/1997 | Kaji | 310/328 |
| 6,411,015 B1 * | 6/2002 | Toda | 310/334 |
| 6,833,656 B1 * | 12/2004 | Hooley et al. | 310/369 |
| 6,870,306 B1 * | 3/2005 | Ajioka | 310/667 |

FOREIGN PATENT DOCUMENTS

| | | |
|---|---|---|
| JP | 1097604 A | 4/1989 |
| WO | WO 01 47041 | 6/2001 |

* cited by examiner

PIEZOELECTRIC STRUCTURES

FIELD OF THE INVENTION

This invention is concerned with novel piezoelectric structures that exhibit "bender" effects, and relates in particular to the construction of benders that are a single, active layer rather than, as is usual, a double layer of the unimorph or bimorph type.

BACKGROUND OF THE INVENTION

Many natural crystalline materials—quartz is an example—exhibit piezoelectric properties—that is, when a piece is squeezed it develops a significant electric potential across the relevant opposite faces. A typical example of this is the spark generator in some gas or cigarette lighters. The opposite effect is also well known; pieces of such materials if subjected to an electric field in an appropriate direction very slightly change dimensions (expanding or contracting, usually observed as a lengthening or a shortening, depending on the field direction). A typical example of this is an ultrasound generator as used in medical body scanning devices. For shape-changing piezoelectric devices which, like these, utilise a single piece, or layer, of piezoelectric material the range of shape changing is usually extremely small—possibly no more than 0.01 mm (10 micrometre).

Much interest is presently being shown in the use of piezoelectric materials to construct actuators for a wide variety of mechanical devices, ranging from loudspeaker drivers to camera lens focusing systems, from electric toothbrushes to computer disk drive head positioners, and from aircraft-wing de-icers to gas valve controllers. Many, even most, of these actuators take the form of a device known as a "bender"—either a composite of a single thin flat elongate layer (like a plank) of piezoelectric material and a similar but inactive layer bonded together face to face to form a beam (a unimorph) and provided with activation electrodes, or a composite of two such piezoelectric material layers similarly bonded (a bimorph) and with electrodes both on each external face and also between the two bonded faces.

During manufacture, such devices are poled—that is, the layers are subjected to a very high electric field. Subsequently, in use the layers are activated by using the electrodes to apply an electric field across the piezoelectric layer, causing the piezoelectric layer to expand/lengthen (or contract/shorten, depending on the field's polarity relative to the poling direction). When such a bimorph device is activated (by using the electrodes to apply an electric field across each layer, the two fields being of the opposite polarity relative to the poling direction), one layer expands/lengthens while the other contracts/shortens. In each case, because of the spatial separation of the device's two layers either side of the joint face (the median plane) the composite is caused to bend (in the case of an elongate beam device one end moves up or down, or back or forth, relative to the other)—and this bending can provide movement and force so as to actuate some suitably-connected machinery. Benders of this two-layer shape-changing sort are capable of providing quite considerable movement, though even the best tend to be restricted to a millimetre or so.

Benders, especially bimorph benders, work well in many situations, but because of the need to have, and connect to, their central electrode they are not as easy to make and use as might be desired.

Examples of known benders and actuators are described in U.S. Pat. No. 3,816,774, in which various, mostly bimorph-type, structures are described. Single-layer serpentine structures are described in U.S. Pat. No. 4,028,566; U.S. Pat. No. 4,284,921 and U.S. Pat. No. 5,633,554 and WO-99/05778. Polymeric piezoelectric transducers of various shapes are described in U.S. Pat. No. 4,056,742 and U.S. Pat. No. 4,284,291.

It would be highly advantageous to be able to do away with the central electrode of bimorph benders, and thus in effect have a relatively simpler one-layer device. Unfortunately, it has hitherto not been possible to achieve with a single layer device the relatively large amounts of shape-change movement attainable using the bending ability of a bimorph or even a unimorph.

SUMMARY OF THE INVENTION

The present invention overcomes the above-mentioned constraint, and provides a device having merely a single layer of piezoelectric material yet which develops on activation a bender-like movement comparable with that hitherto only achievable using a bimorph or unimorph. It does so by so physically structuring—that is to say, shaping—the single, piezoelectric, layer so that it has in effect separately-actuatable portions just like a bimorph bender.

More specifically, the invention proposes that an equivalent to the spatial separation either side of a nominal median plane that is inherent in a bimorph (with one piezoelectric layer on one side, and the second on the other side of the plane) be attained by structurally shaping the cross-section of a simple, single piezoelectric layer such that it has a multiplicity of piezoelectric portions arranged in two generally-planar groups one either side of a median plane, so that any dimension change undergone by a portion on one side of that plane will tend to bend the whole device in the opposite direction to the same sense dimension change undergone by a portion on the other side of that plane. Thus, if each piezoelectric-layer portion in the group on one side of the median is expanded/lengthened then the whole will become convex with that group on the outside, while if instead each layer portion in the group on the other side is expanded/lengthened then the whole will become convex with that group on the outside. Moreover, if each portion in the group on one side is expanded/lengthened while each portion in the group on the other side is contracted/shortened, then the bending is significantly increased. And in each case, the simple, single layer acts as though it were a bimorph—if elongate and beam-like, bending along its length, one end moving up/down, or back/forth, relative to the other—but without any need for the middle, internal, electrode.

In one aspect, therefore, the invention provides a piezoelectric device the body of which is a simple, single layer of piezoelectric material physically shaped so as to have a multiplicity of seperate, distinct piezoelectric portions disposed in two generally planar groups that extend along, one on each side of, a nominal median plane through the whole body, which groups are thus spatially separated by and face each other across that median plane, with the result that any piezoelectric portion dimension change in the group on one side of the median plane will tend to bend the device normal to the median plane in the opposite direction to the same-sense piezoelectric portion dimension change in the group on the other side of that median plane.

Though, as discussed in more detail hereinafter, the device may have any overall shape, one preferred such shape is that of an elongate body, like a beam. The beam may be fixed at one proximate end and free to move at a distal end.

However, beams can be supported at both ends with a bending middle section. Thus, the invention provides a piezoelectric device that is a simple, single-layer elongate body physically shaped in a direction across the length of the elongate body so as to have separate, distinct piezoelectric-portion groups extending along the body and on each side of a nominal median plane through the whole body, which groups are thus spatially separated by and face each other across that median plane, with the result that any piezoelectric portion dimension change in the group on one side of the median plane will tend to bend the whole device normal to the median plane and along its length in the opposite direction to the same sense piezoelectric portion dimension change in the group on the other side of that median plane.

The invention provides a simple, single layer, piezoelectric device—by which is meant that the device has one layer only, and that this layer is made of a piezoelectric material. This is distinct from a unimorph device, where there may be a single piezoelectric layer but there is also another, albeit inactive, layer. Having said that, the invention nevertheless encompasses devices which are made of a plurality of separate simple, single layer devices formed into a stack. The distinction is as that between a sandwich, where, though there are two layers of bread plus a layer of filling, nevertheless the combination makes a notionally indivisible whole, and a pack of cards, where there are many individual cards stacked one against the next yet remaining separate.

The piezoelectric material used may be of any convenient sort; a typical one, preferred because it is easy, in its "green" state, to form it into the structures desired, is piezoelectric ceramic material such as PZT (lead zirconium titanate, available as a sinterable powder which can be mixed with binders and formed into a paste, then shaped by, for example, rolling, pressing or extruding, then cured [to remove the binders], then sintered [like firing clay, to density and fix its shape] and then poled [to set its piezoelectric properties]). Another possible piezoelectric material are polymeric based such as PVDF (Polyvinylidene difluride).

The invention's device may take any convenient shape, though as noted one preferred such is an elongate body—by which it is meant that, rather like a tape or rule, its length is considerably greater than its width (as, indeed, is so with most bimorph benders). For the most part, indeed, the body is conveniently tape-like, albeit a tape that may itself be curved into other shapes. However, as is seen graphically in the accompanying Drawings (discussed further hereinafter), the elongate body: need not be straight, like a tape, but can be curved; need not be parallel-sided, like a tape, but can (for instance) be triangular; and need not be long and thin, like a tape, but can be disk-like (though a disk-shaped body could, for the purposes of this invention, be considered as a number of triangular "radial" segments fixed side by side round in a circle).

The body of the single layer device of the invention is physically shaped—if the body has a length greater than its breadth then this shaping is conveniently though not necessarily in a direction lying across the length of the body—so as to have separate, distinct, piezoelectric portions disposed in two generally planar groups one on each side of a nominal median plane through the whole body (by "generally planar" is meant that, while the individual portions in either group may not be either flat or disposed to be co-planar with each other, the group as a whole extends over a plane). There are many possible "shapes" that can be used to provide the required separation of the body into separate, distinct, portion-containing groups (and some of these are discussed hereinafter with reference to the accompanying Drawings), and perhaps that shape easiest to understand—and therefore best for facilitating comprehension of the concept behind the invention—is that of a simple sheet of corrugated iron (as sometimes employed in the construction of prefabricated buildings).

Such a body is an elongate body—with a length greater than its width—which is generally planar but has been uniformly corrugated for its entire length (that is, the lines of corrugations run the length of the body) across its width—that is, in a direction across its length. A cross-section of the body across its length would reveal the shape of the corrugations (in conventional corrugated iron these are either sinusoidal or they are semicircular; each is satisfactory). The centre line running along that section from side to side extends all the way along the sheet, and thus forms the sheet's median plane; half of the corrugations are on one side of that plane—the top, say—and the other half are on the other side—the bottom. The portions of the sheet represented by the peaks (on the top side) are thus disposed in a generally-planar group which is spatially separated from, and distinct from, yet faces the similar generally-planar group formed from the portions represented by the troughs (on the bottom side).

If, with such a corrugated body, all the peak portions (in the top group) were caused to expand, the body's dimensions (and particularly its length) on its upper side would increase, and it would bend down, normal to the median plane, away from that side—it would become convex, with that upper side on the outside. If, instead, all the trough portions (in the bottom group) were caused to expand, the body's dimensions on its lower side would increase, and it would bend up, normal to the median plane, away from that side—it would become convex, with that lower side on the outside.

If, alternatively, all the peak portions (top group) were caused to contract, the body's dimensions on its upper side would reduce, and it would bend up, towards that side—it would become concave, with that upper side on the inside. If, instead, all the trough portions (bottom group) were caused to contract, the body's dimensions on its lower side would reduce, and it would bend down, towards that side—it would become concave, with that lower side on the inside.

It will be easy to see that were the peak portions (top group) to expand and the trough portions (bottom group) to contract, the body would exhibit a tighter, more forceful, downwards bend.

So, the body is physically shaped, advantageously across its length (in cross section), so as to have separate, distinct piezoelectric portions in two groups one on each side of a nominal median plane through the whole body. The simplest such shape is probably a V-shape, with the median plane extending across the arms from the centre line of one to the centre line of the other, so that the two free tips/edges are one side and the corner angle is the other. In this case the two tips lie in one of the groups, and the corner angle lies in the other (and it can be seen, with some good will, that the two groups can be described as generally planar, and facing each other across the median plain). The next simplest shape is perhaps a U-shape—like an expanded V—the arms of the U being pushed slightly outwards; with the median plane cutting the U in half horizontally, top and bottom, the arms become the portions in the group on one side, the base the portion in the group on the other side.

In both the V- and U-shaped devices there are three distinct piezoelectric portion, two in the top group and one in the bottom group.

After these simple shapes there is the plain corrugated sheet discussed above—this can be seen to be much like a multiplicity of Us joined side by side—and a variant on that, in which the corrugations are square rather than curved. Another variant is that wherein the corrugations are reversed halfway along the body, so that the peaks become troughs, and the troughs peaks. As discussed hereinafter, such a body upon activation curves along its length into an S-shape, as under identical stimuli the two halves react in the opposite manner.

A further important shape, alluded to above, is that of a (part) ring or annulus, as though a tape-like body were bent round in its own plane, to bring its two ends towards each other to form an object like a broken washer. As is discussed in more detail hereinafter, such a shape can be corrugated in a number of ways—the corrugations can be straight across the annulus, and thus generally radial, or they can be at some angle to the theoretical radii, and they can be either actually straight or alternatively slightly curved into arcs.

Annular devices of this sort are hitherto unknown, and in another aspect the invention provides them per se. Thus, it provides a piezoelectric device that is a generally planar single-layer arcuate strip-like body having overall a broken annular shape, the body being physically shaped in a direction along its arcuate length so as to have corrugations extending across the strip, these corrugations forming separate, distinct piezoelectric-portion groups extending along and on each side of a nominal median plane through the whole body, which groups are thus spatially separated by and face each other across that median plane, with the result that any piezoelectric portion dimension change in the group on one side of the median plane will tend to bend the strip normal to the median plane across its length in the opposite direction to the same sense piezoelectric portion dimension change in the group on the other side of that median plane.

As noted, the corrugations can be straight across the strip, and thus generally radial, or they can be at some angle—45 degrees, for example—to the theoretical radii, and they can be either actually straight or alternatively slightly curved into arcs. Moreover, the arcuate strip can itself be dished— slightly curved across its length. Examples of these possibilities are shown in the accompanying Drawings; it is worth noting here that the different forms have different deformations when activated. Thus, in a strip device where the corrugations are angled at 45 degrees to the notional radial direction the ends move relative to each other in the direction of the notional axis of the strip, though the force generated is limited because the strip can relatively easily bend along a line parallel to the length of the corrugation. However, if the corrugations are curved in the plane of the strip, or if the strip is dished, then it bends much less easily, and so can apply a greater force when actuated.

Within reason, for a corrugated body useful in the piezoelectric devices of the invention the exact form of the corrugations does not particularly matter; it is the second moment of area that counts (in mathematical terms the force generated by any small area of a section of the body is the integral, over the height of the section, of the square of the distance of that area from the neutral axis; the neutral axis plane for any piezoelectric device is that plane within which there is no induced strain when the device is operated). It does not matter if the corrugations are arcs or sine waves or squared etc. However, by choosing one shape over another the mechanical properties of the device can be adjusted, and thus "tuned" to a particular use.

The number of piezoelectric portions in each group is not that important, provided there are sufficient (and here the term "multiplicity" is to be construed as meaning at least three, so that there are at least two portions in one group and one in the other, as noted above for both the V- and U-shaped devices). Clearly, though, the more portions of a given size there are, and the more evenly they are disposed either side of the median line, the greater will be the force applicable in operation by the device. In a beam-shaped corrugated device, then, there might be seven portions, three on one side and four on the other; in a disc-shaped device there might be 24 portions, 12 on each side; in a curved strip device (of the sort described further in connection with the drawings) there might be as many as, or even more than, 40 (20 and 20). It is generally preferable for the corrugations to be disposed evenly and symmetrically about a centre line normal to the median plane, rather than for there to be more, or greater, corrugations adjacent one edge than the other.

In the device of the invention the piezoelectric portion groups one on each side of a nominal median plane through the whole body. This median plane may notionally be anywhere within the body—provided, of course, that there are indeed two piezoelectric-portion groups one either side of it—but most conveniently it will be co-planar with the device's neutral axis plane. Usually, the neutral axis plane is that plane about which the device is generally both physically and piezoelectrically balanced—in the present case, then, the piezoelectric portions, and the forces they engender, would be evenly disposed either side of the median plane.

The dimensions of devices of the invention may vary from fractions of a millimetre to many millimetres. However, the relative sizes of dimensions must be determined for specific geometries. Nevertheless, for devices where the corrugations are not parallel the pitch of the corrugations should be relatively small compared to the smallest in-plane dimension of the device. Indeed, in some such devices (tape-form devices, as discussed further hereinafter with reference to the accompanying Drawings) the pitch of the corrugations should be several times smaller than the width of the tape, to ensure the corrugations appear as unidirectional benders on the scale of the device.

In operation the device of the invention, which has portions in groups that are spatially separated across the notional median plane, bends as the result of any dimension change of the piezoelectric-layer portions in the group on one side. Moreover, any piezoelectric portion dimension change in a group on one side of the median plane tends to bend the whole device in the opposite direction to the same-sense piezoelectric portion dimension change in the group on the other side of that median plane.

The portion dimension change is that associated with applying an electric field across a piezoelectrically-poled layer, and as might be expected the exact nature of the change—whether it is an expansion or a contraction— depends upon the direction of the field and of the piezoelectric-layer portion's polarity. Piezoelectric materials are poled by subjecting them to a very strong electric field, which causes the individual domains within the material to align with the field. If the subsequently-applied activation field is then in the same direction as the poling field the material expands, while if it is then in the opposite direction the material contracts. It will be understood, therefore, that the direction/nature of a "bend"—a dimension change—of each piezoelectric-layer portion in a device of the invention depends both on how that portion was poled and on the direction of the activation field. It will thus be appreciated that the appropriate "bend" result can be achieved either by poling the complete piezoelectric layer in the same direction and then applying the activating field to the top and bottom portions in opposite directions, the top in one and the bottom in the other, or doing it the other way round, poling the layer's portions oppositely—the top ones one way, the bottom ones the other—and applying a single activating field in the same direction all over.

The device of the invention has a simple, single layer of piezoelectric material physically shaped so as to have separate, distinct piezoelectric portions in two groups one on each side of a nominal median plane through the whole body. This shape can be attained in any way possible. For example, it may be formed by extruding (through a suitably-shaped orifice) a supply of plastic piezoelectric material (such as PZT paste), or by pressing (into a mould) a sheet of such material. This is quite useful for making complex corrugated shapes which are subsequently fired/sintered. Alternatively, a body of cured piezoelectric material for example a sheet of sufficient thickness may be carved or cut into the desired corrugated shape.

In the devices of the invention the bending deformation and/or moment generated by the application of activation voltages (electric fields) is, as noted above, dependent on the second moment of area of the cross-section, which, for the case of a regularly-corrugated device, is determined mainly by the size of the corrugations, and to a lesser extent the thickness of the piezoelectric sheet or layer. This means that the proposed invention enables there to be designed a bender suited for use with a specific voltage—which is determined by the nature of the piezoelectric material and the thickness of the layer—and quite independently of the desired motion or blocking force—which depend on the generated force, and particularly on the stiffness and rigidity of the device (the greater these are the less the device will bend and buckle when pushing against something). Such a device does not currently exist.

Piezoelectric devices which have a corrugated nature have already been described in the Art. However, they are invariably two-layer devices, typically bimorphs, and apart from their corrugated nature are therefore constructed, and function, in a different manner to the single layer devices of the present invention. Thus, a corrugated bimorph device as known in the Art, where the peaks are activated in the opposite sense to the troughs, will deform so as the increase or decrease the wavelength of the corrugations, and so it will change shape—it will expand or contract—in the plane of the corrugations. It is therefore acting as a linear actuator. In the present invention, however, a single layer piezoelectric sheet with straight corrugations bends out of the plane of the corrugations, and along the corrugations not across them.

These and other features of the inventions will be apparent from the following detailed description of non-limitative examples making reference to the following drawings.

DETAILED DESCRIPTION

Figure 1A:
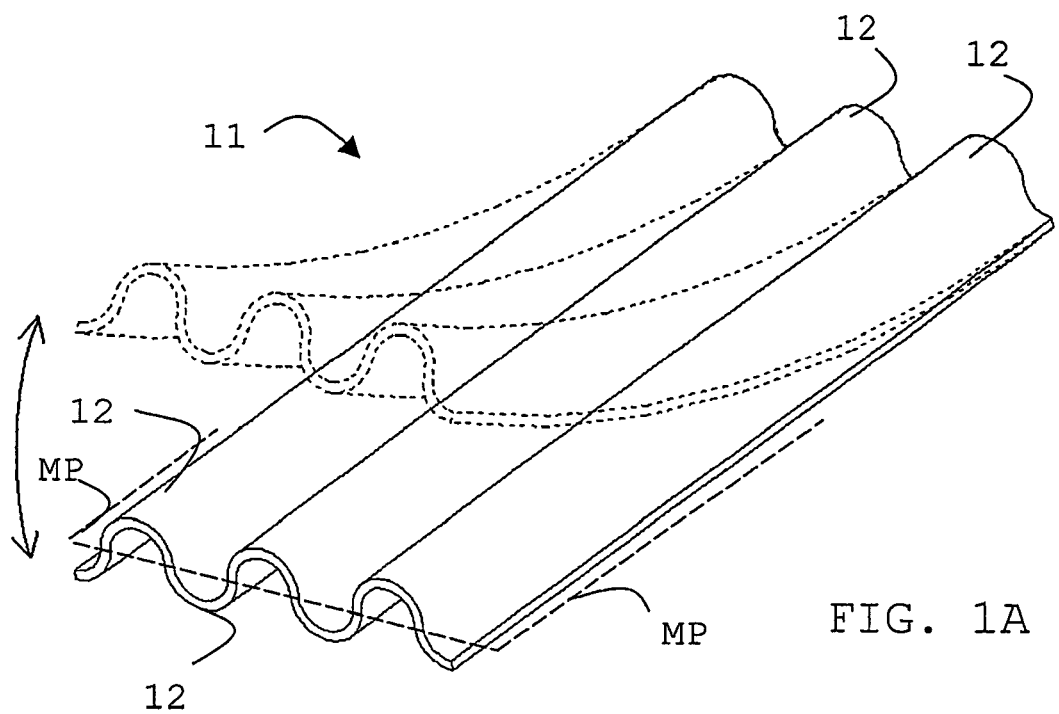
FIGS. 1A, B shows in perspective and end view a single-layer corrugated piezoelectric device of the invention.

FIG. 1A shows in perspective a single-layer corrugated piezoelectric device of the invention; it shows how a straight bender can be made from merely a single layer of piezoelectric material and the appropriate electrodes.

The device is little more than an elongate sheet 11 of piezoelectric material that has been pressed (or folded) into a simple corrugated shape with the semi-circular corrugations 12 running the length of the sheet. The sheet has a notional median plane MP shown dashed, and has seven clearly distinct piezoelectric portions, three on one side (the upper half, as shown) and four on the other (the lower half). The upper three belong to one group that is generally planar, and the lower four belong to the other group. These groups are shown in dashed boxes U and L in FIGS. 2A, B to be discussed below.

Figure 1B:
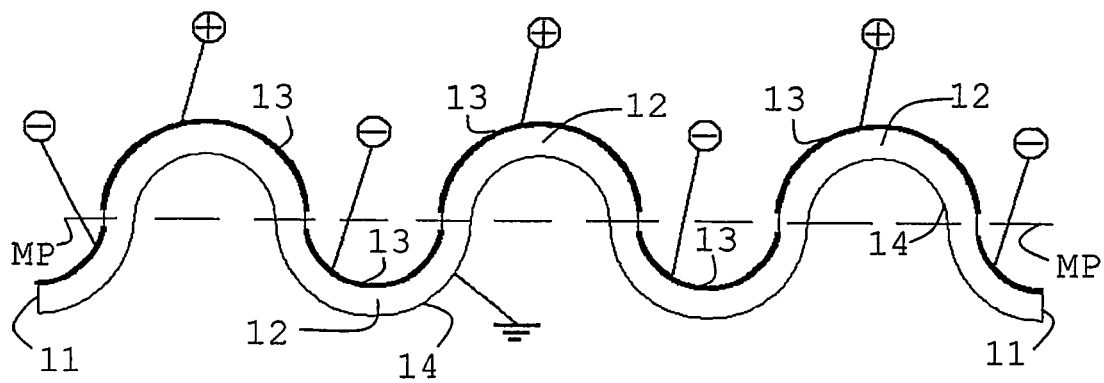

The sheet has, at the appropriate manufacturing stage, been poled—that is, its piezoelectric crystals have been forced by a strong applied electric field to align themselves pointing along the thickness of the sheet—and formed on the top (as viewed) surface of the sheet 11 is a whole series of separate electrodes 13 (shown in FIG. 1B only), while formed on the bottom (as viewed) surface is a single continuous electrode 14. Together these make effective pairs of electrodes, and in each such pair's case a small electric field applied using that pair will cause the piezoelectric material in the corrugation to expand or contract, depending on the direction of the field relative to the poling direction.

As shown in FIG. 1A, the top electrodes 13 are separate but the bottom electrode 14 is a single, continuous electrode. How this works can be understood simply by imagining the continuous one is neutral, say (it is shown earthed), and then considering the electrical fields across each alternate corrugation. The applied voltage alternates between adjacent electrode pairs from positive to negative voltage as indicated by the circled plus and minus signs. One such field will be from neutral to plus—upwards, as shown—while the adjacent ones will be from minus to neutral—downwards, as shown. So, even with one of the electrode sets being continuous there can still be set up alternate opposed activation fields (up, down, up, down, . . . and so on).

If, as shown, the applied activation field alternates between adjacent electrode pairs, so each is in the opposite sense of that of its immediate neighbours either side, then all the corrugations on one side of the sheet 11 (and thus on one side of the median plane MP) will suffer the same effect—expansion or contraction, depending on the field direction—while all the corrugations on the other side of the sheet 11 (and on the other side of the median plane MP) will suffer the opposite effect. So if, say, all the upper (as viewed) corrugations contract, then all the lower corrugations expand, and because the upper and lower corrugations are spaced across the median plane it necessarily follows that the sheet as a whole bends normal to that plane as dictated by these contractions and expansions—namely up, as shown by the dotted lines in FIG. 1A.

Were the fields to have been the other way round then the sheet would have bent downwards, instead.

In this way a single sheet of piezoelectric material behaves just like a unimorph or bimorph, yet without the need for two layers, and without the concomitant need for, and the problem of, a central electrode.

Figure 2A:
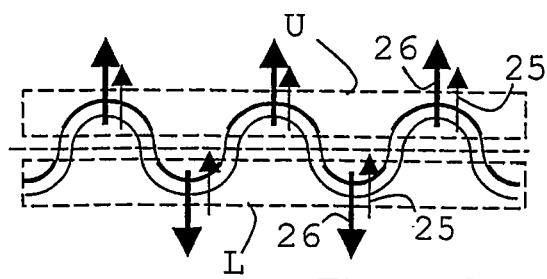
FIGS. 2A, B show in end view the electrode arrangement (and possible poling and actuating field directions) for the FIG. 1 device.
Figure 2B:
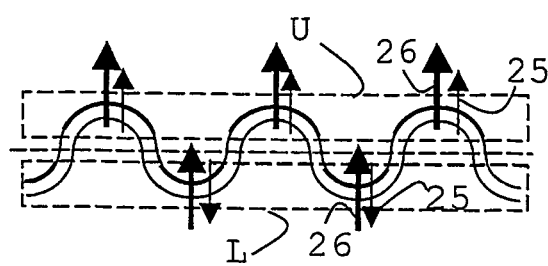

FIGS. 2A, B show two possibilities for poling direction (the feint short arrow 25) and actuating electric field direction (the heavy long arrows 26). In FIG. 2A the entire sheet has been poled in the same direction 25, while the electric fields direction 26 alternate, while in FIG. 2B it is the electric fields 26 which are in the same direction and the poling 25 that alternates. The effect, though, is the same.

FIGS. 2A, B also show how the piezoelectric portions are arranged in two essentially planar groups defined by the dashed boxes U and L which are so disposed as to face each other across the median plane and wherein the portions in one group expand while the portions in the other group contract.

Figure 3A:
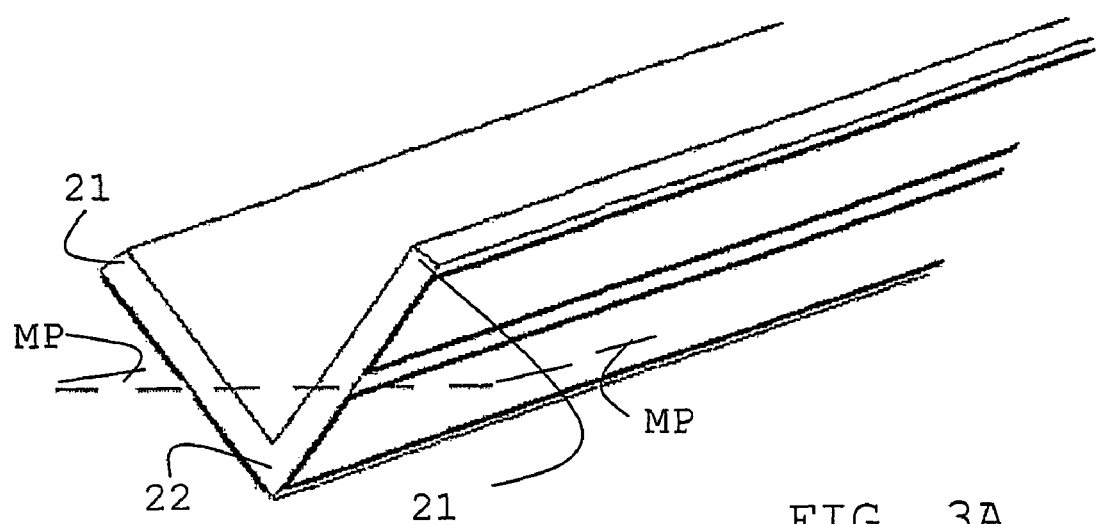
FIGS. 3A, B show in end view V- and U-section devices of the invention.
Figure 4:
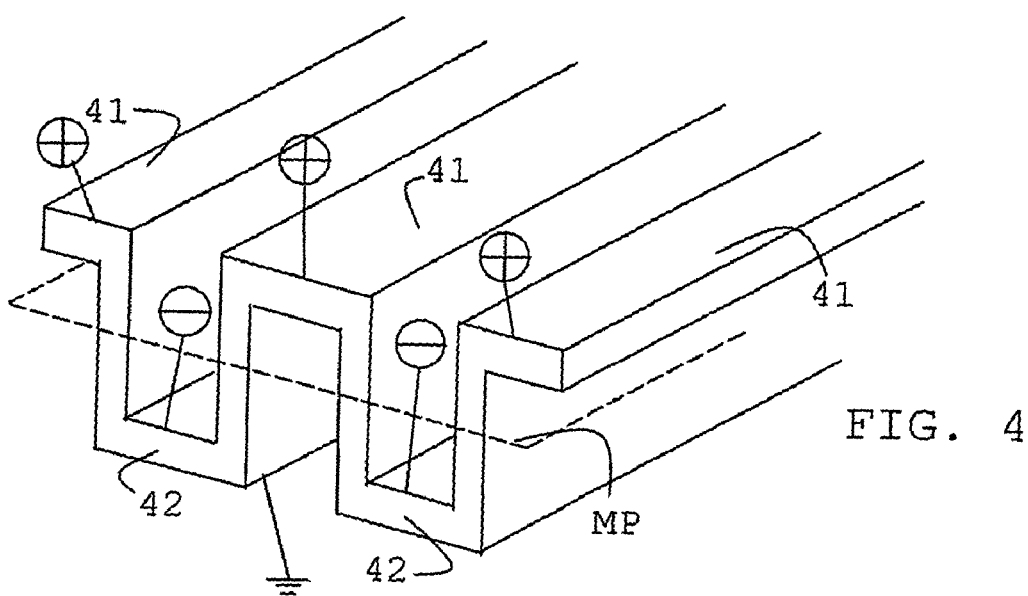
FIG. 4 shows in end view a rectangularly-corrugated device of the invention.

Although the example shown in FIGS. 1 and 2 is for a corrugated cross-section, any cross-section that is not linear will work if regions above or below a neutral axis of the cross-section are deformed differently. FIGS. 3A and B show a V-section device of the invention and a U-section device, and FIG. 4 shows a rectangularly-sectioned corrugated device. All these work in much the same way.

Figure 3B:
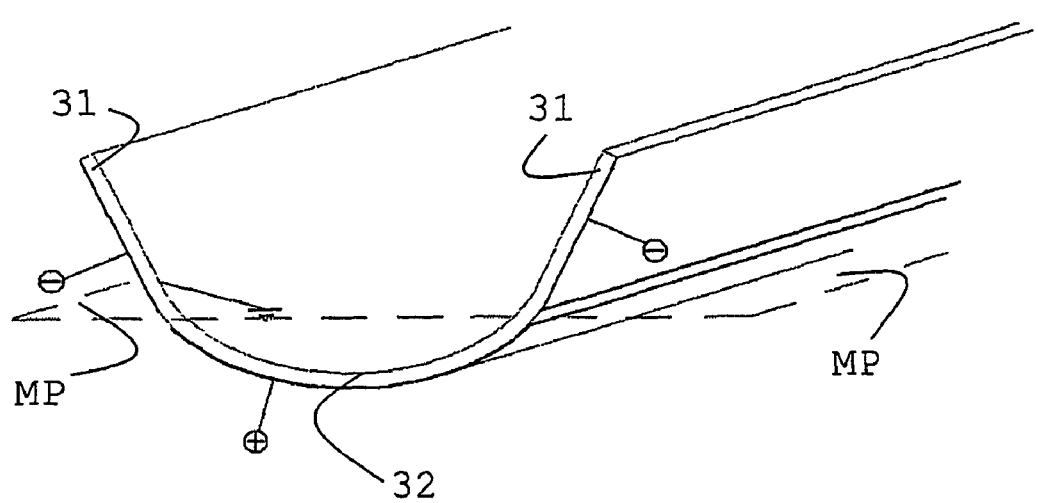

Thus, in FIG. 3A the median plane runs horizontally (as viewed) through the V so that its two tip portions 21 form a generally planar group lying on one side of the median plane MP while its lower v section 22 is the group on the other side. The U-shaped device of FIG. 3B is much like a "wide" version of the V-shaped device of FIG. 3A, with its two arms 31 forming the generally planar group on one side of the median plane MP and its base 32 the group on the other.

The FIG. 4 is a rectangularly-sectioned corrugated device. The upper (as viewed) corrugations 41 are in a generally planar group on the opposite side of the median plane MP to the group of its lower corrugations 42, and in the example shown there is a single bottom electrode (not shown separately, but earthed/grounded), while the top electrodes (again not shown separately) are alternately plus and minus as indicated by the symbols in the circles.

Figure 5A:
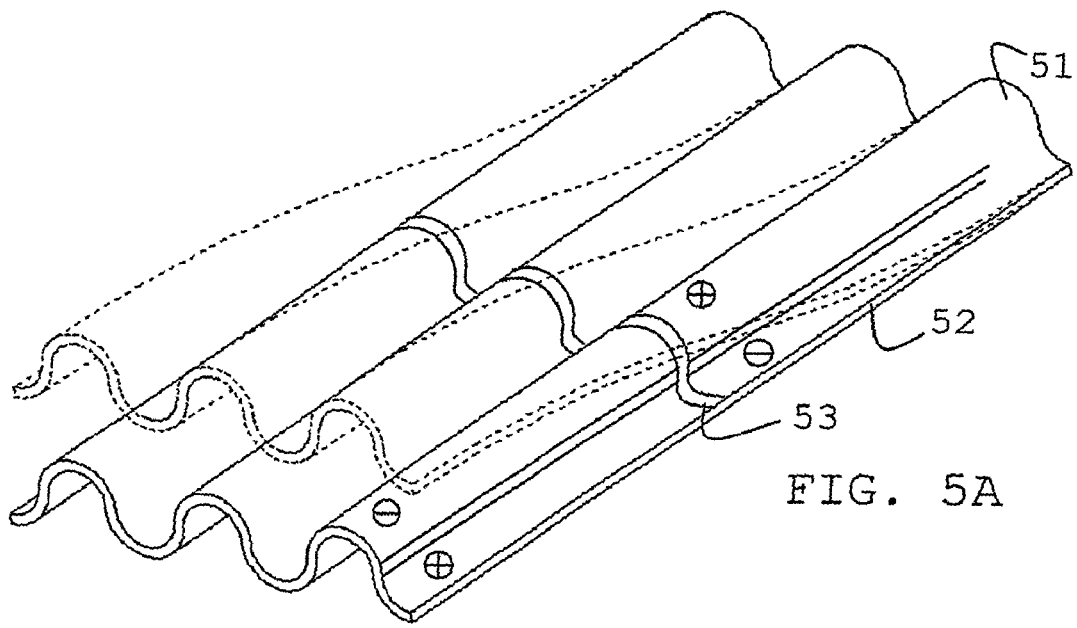
FIGS. 5A and B show (in perspective) two "S"-bending devices of the invention.
Figure 5B:
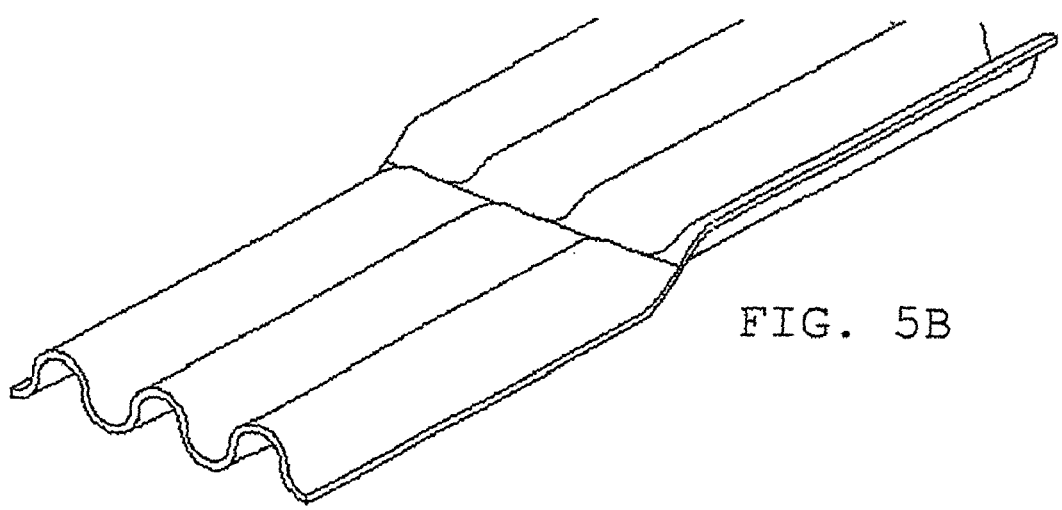

FIGS. 5A and B show (in perspective) two "S"-bending devices of the invention—that is to say, devices designed, shaped and operated to bend into an S-shape. The advantage of this type of deformation is that it enables devices to be stacked, one on top of the next (rather like the crease of a piano accordion bellows), to amplify the movement. For this purpose its is required that the piezoelectric material deform differently in each half of the device—expanding on top at one end while contracting on top at the other. To achieve this in one way, the electrodes are split half way down the device along line 53, as is the case in the device of FIG. 5A where line 53 indicates the split electrodes. In a first corrugation 51, 52 the field direction are indicated by the respective symbols. In an alternative way the direction of the corrugations is changed halfway along, as is shown in FIG. 5B.

Also, two S-bending devices can be combined with the free (distal) end sections abutting, resulting in a strip of twice the length, and, if the other (proximate) ends are fixed, a bulging middle section upon activation.

Figure 6A:
FIGS. 6A, B, C and D show (in side perspective and cut-away view) two different doming corrugated devices of the invention.

FIGS. 6A, B, C and D show (in side, perspective and cut-away view) two different doming corrugated devices of the invention.

The device is basically a "flat" disc of piezoelectric material. It can be corrugated in either of two different ways—the two FIGS. 6B, C and D show these two types of corrugation, one radial (6B), the other circumferential (6C, D). FIG. 6A shows, from the side, how each device moves upon actuation—moving from a generally flat, planar object (the solid outline) to take up a domed shape (the dashed outline). Either corrugated form can be utilised to achieve this type of shape change.

Figure 6B:
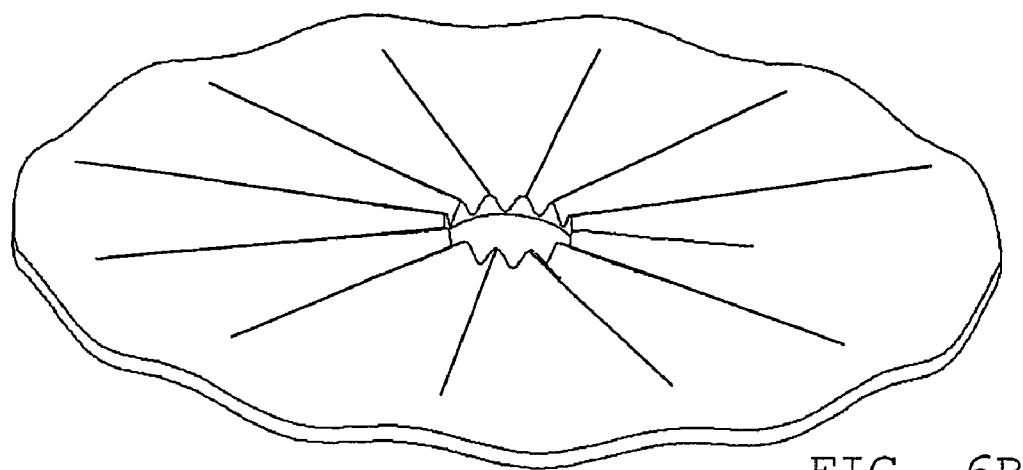
Figure 6C:
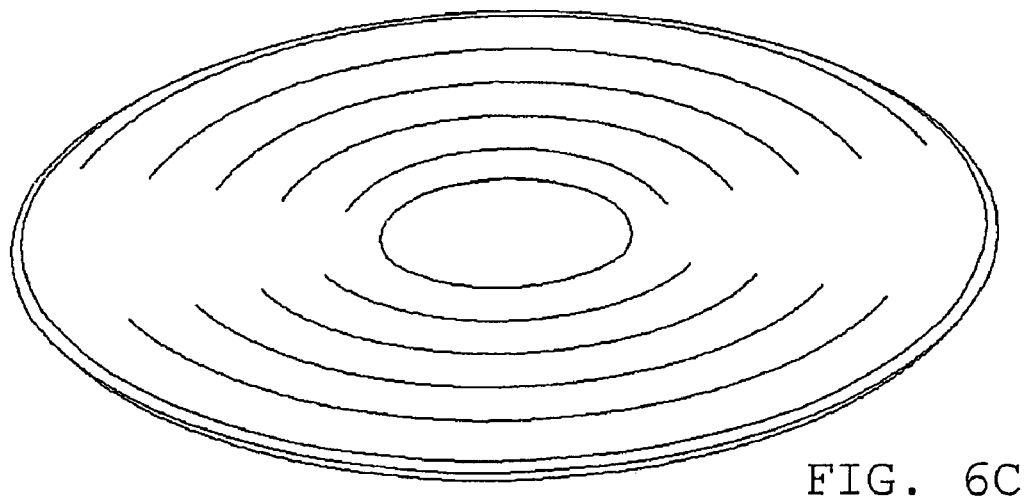
Figure 6D:
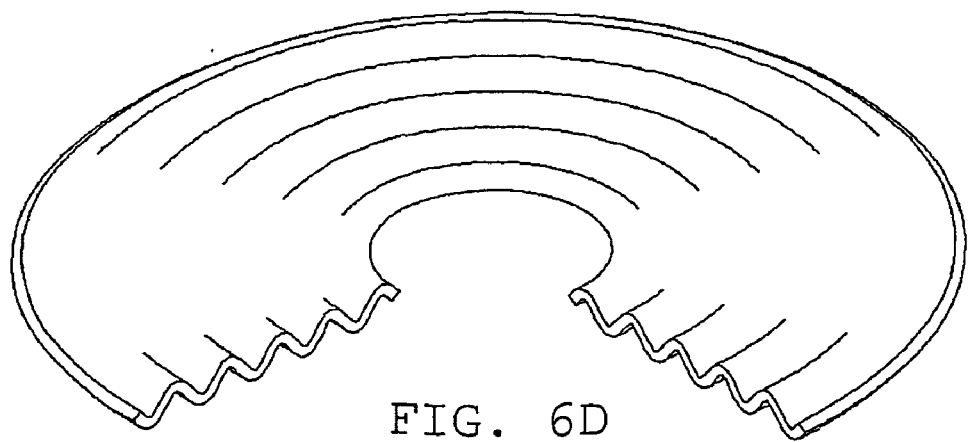

Typical dimensions for a domed device of the type shown in FIG. 6B made from PZT4D would be an outer diameter of 15 mm, a thickness of 20 ìm, and a mass of 27 mg. The dome should then exhibit a corrugation amplitude of 20 ìm, and a corrugation pitch of approximately 0.5 mm. With an operating voltage of ±20V there should be obtained a displacement of ±0.1 mm with a blocking force of 7 mN.

FIGS. 7A–D show (in plan, perspective, side and end view) a linear strip corrugated device of the invention.

Figure 7A:
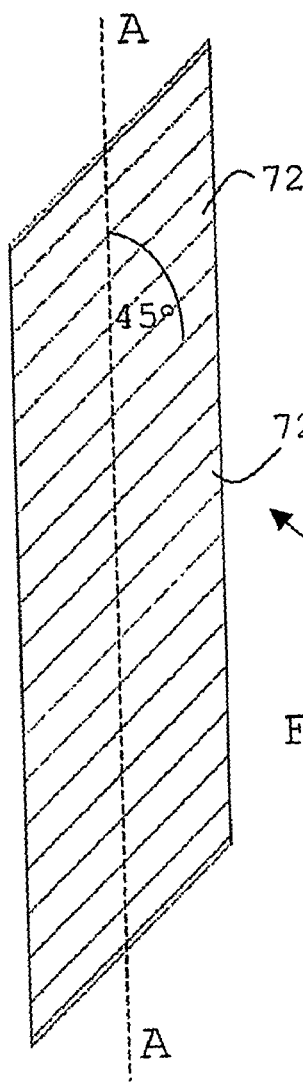
FIGS. 7A–D show (in plan, perspective, side edge and end view) a linear strip corrugated device of the invention.
Figure 7D:
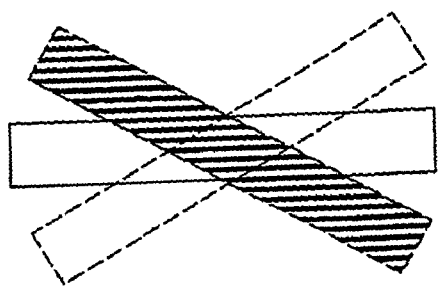
Figure 7B:
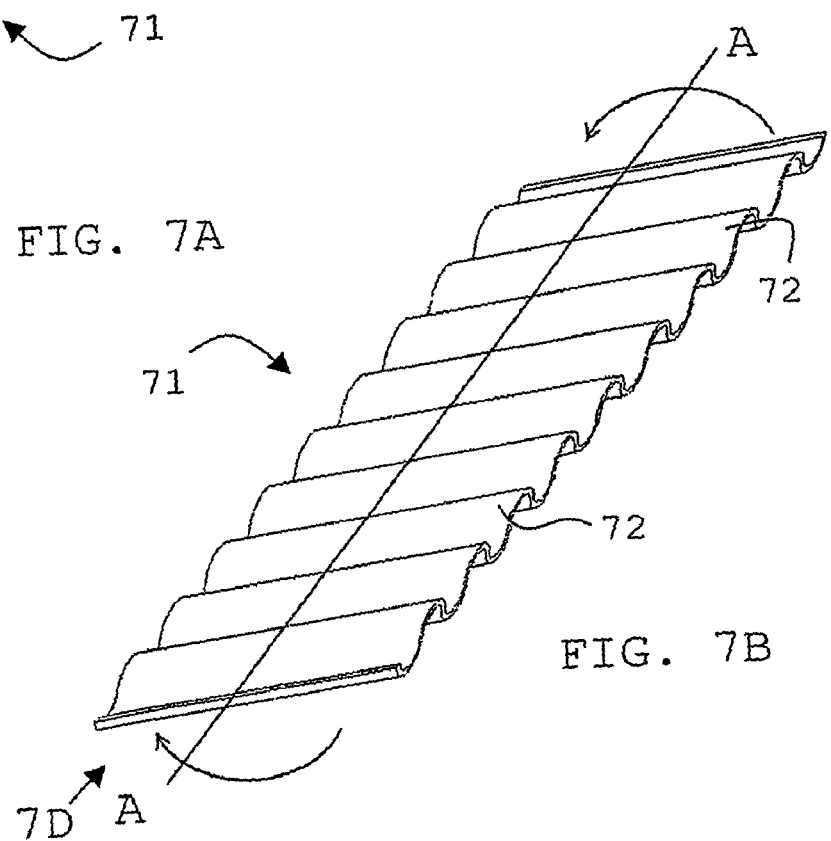
Figure 7C:
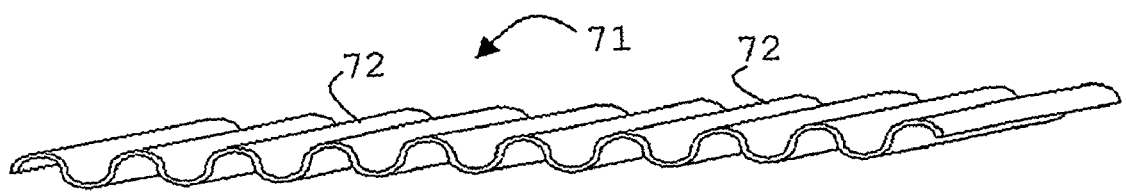

The device is a linear strip 71 of piezoelectric material corrugated across rather than along the length of the strip. However, the corrugations 72 are angled (at about 45 degrees to the long axis A—A of the strip) rather than straight across; since the bending action of the device is only along the length of the corrugations 72, and not perpendicular to them, the angled corrugations 72 have the effect of twisting the strip about its axis A—A. The general sense of the twisting is shown in FIGS. 7B, D (the latter is what can be seen on actuation looking along the axis in the direction of the axis A—A; what actually happens might be subtly different, depending on the exact nature of the corrugations).

Figure 8A:
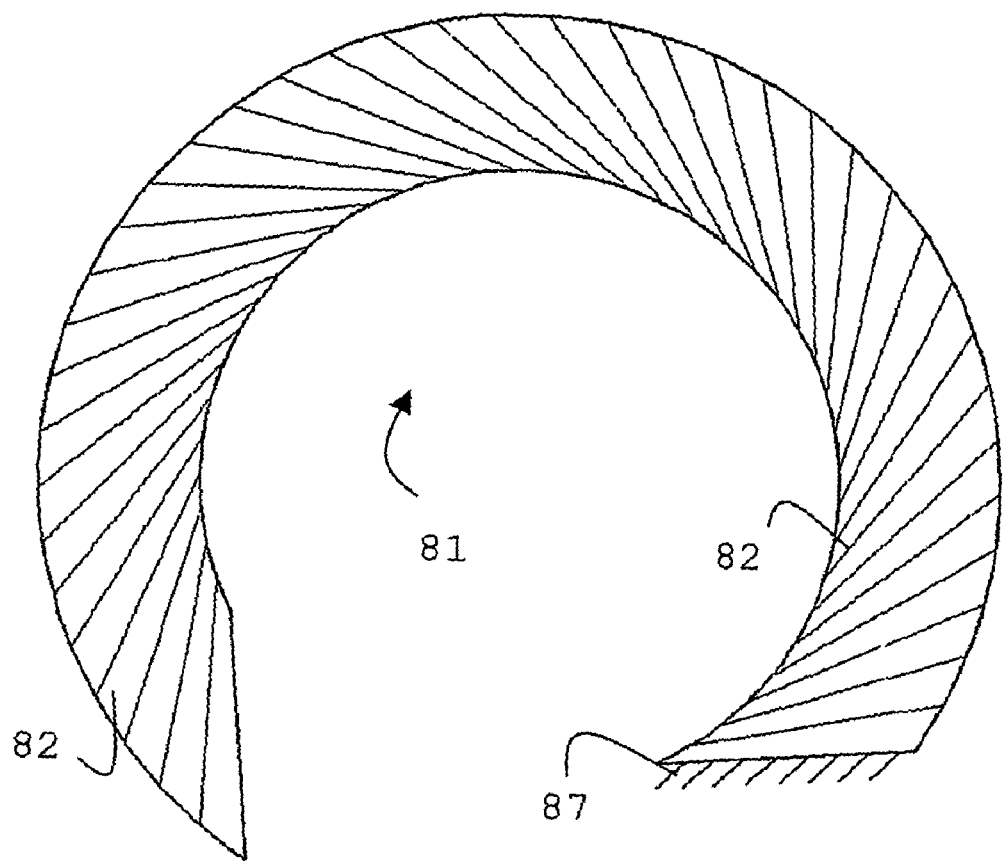
FIGS. 8 and 9 show (in plan and perspective view) two different curved strip corrugated devices of the invention.
Figure 8B:
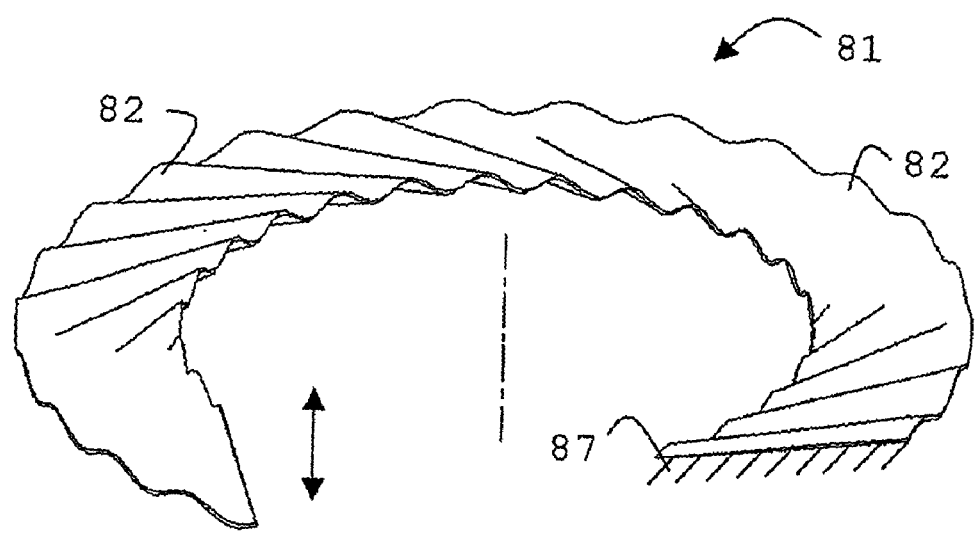
Figure 9:
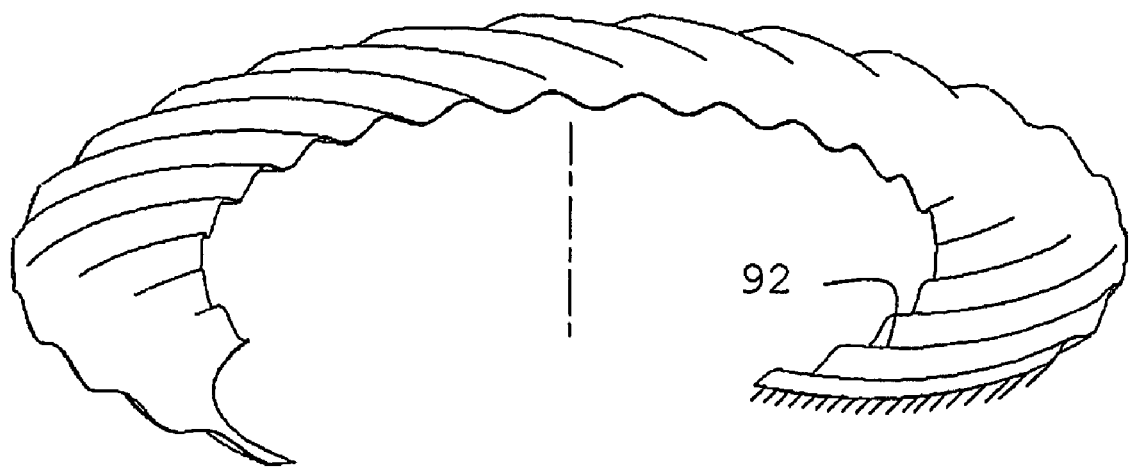
Figure 10A:
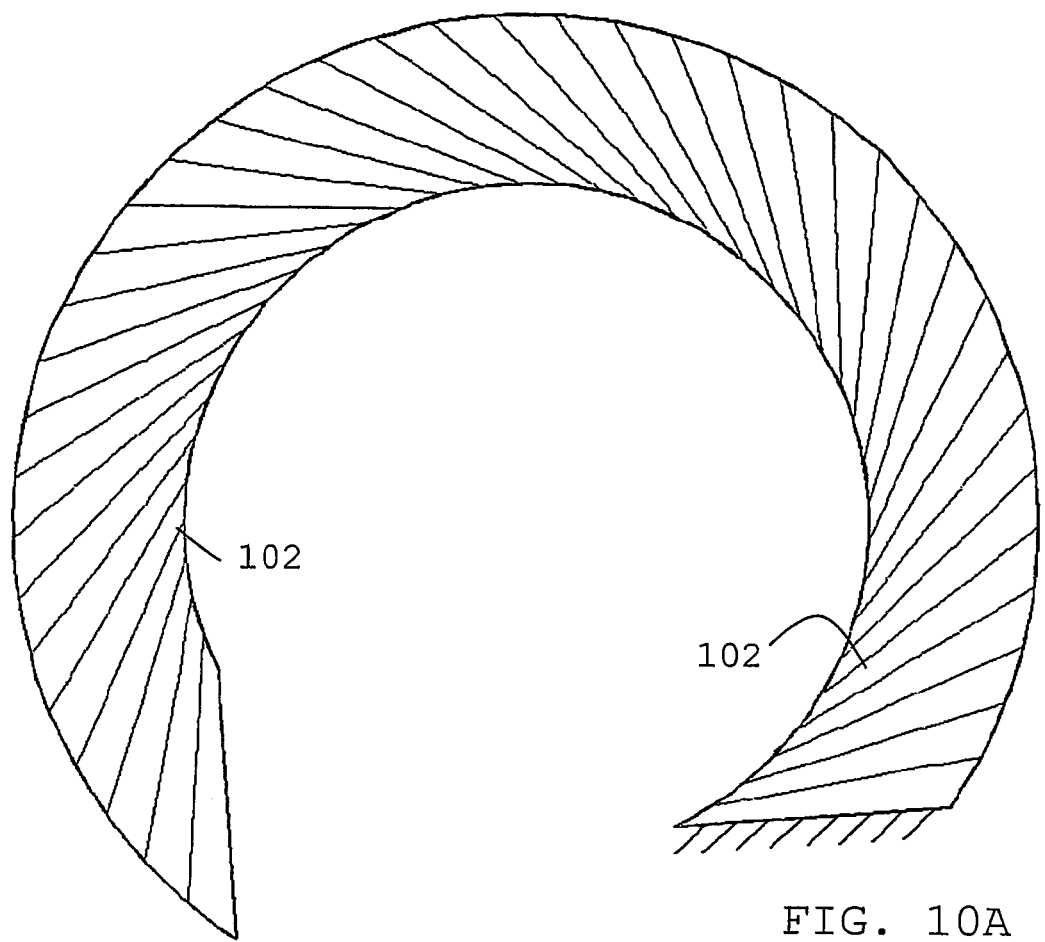
FIGS. 10A–C show (in plan, perspective and sectional view) a third curved strip corrugated devices of the invention.
Figure 10B:
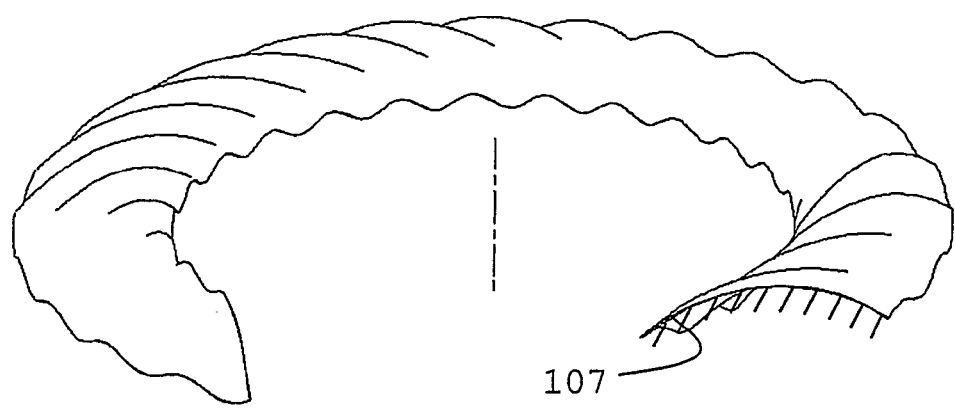
Figure 10C:

The geometry represented by FIG. 7 can then be curved into an arc to create a variant that deforms up and down across the plane of the arc. FIGS. 8–10 show (in at least plan and perspective view) three different arcuate strip corrugated devices of the invention.

This type of structure, novel and inventive in its own right, demonstrates a device geometry that significantly amplifies the normal relatively small deformation of piezoelectric materials to produce a large displacement.

The manner in which such structures works is complex, and not easy to appreciate. The following comments may assist.

Consider a (planar) circular arc 81, fixed at one end 87 (as shown in FIG. 8). If the arc is deformed into a helix of the same radius, the free end has moved out of the plane of the circular arc. It is this deformation that the structure induces in a corrugated piezoelectric tape that nominally forms part of a circular arc. The same principles apply if considering a spiral curve fixed at one end. This out of plane deformation is achieved if torsion is induced in the arc.

As noted, FIGS. 8–10 show three different curved strip corrugated devices. FIG. 8 shows one in which the corrugations 82 are not straight across the strip but at an angle (of about 45 degrees) to the tangent to the curve. These corrugations are straight, and the strip 81 is otherwise flat; in FIG. 9, however, the corrugations 92 are themselves arcuate (albeit generally also at 45 degrees), while in FIG. 10 the corrugations 102 are straight (and at 45 degrees), but the strip has itself been curved/dished to take on a three-dimensional aspect, best seen at the fixed end 107. Arbitrary cross-sections 108 along the device show the superposition of the arcuate strip and any curvature introduced by the corrugations.

The reason for curving the corrugations as in FIGS. 9 and 10 is to increase the blocking force of the device. It is easy to bend straight corrugations (as in FIG. 8) perpendicularly to the direction of the corrugations, and curving them resists this bending. The FIG. 10 "out-of-plane" curve to the corrugations gives the best results, and in addition seems to increase the amount of movement. Therefore the geometry shown in FIG. 10 gives the best performing actuators.

This geometry can produce a large actuation device pressed from a single layer of piezoelectric material. Thus, using PZT4D as the piezoelectric material, and constructing an arcuate strip of outer diameter 15 mm, inner diameter 10 mm, and tape thickness 20 im, with corrugation amplitude 0.25 mm, corrugation pitch approximately 1 mm, and mass 15 mg, there should be obtained, with an operating voltage of ±20V, a displacement of ±0.25 mm with a blocking force of 0.3 mN. This would be an excellent result.

The corrugations shown in the devices of FIGS. 8–10 are all regular, all at the same angle to the radial direction. An interesting property of the deformation of a circular arc into a helix by the application of a torsion is that the deformation does not increase linearly around the length of the arc. However by suitably varying the angle of the corrugations around the arc, it may be possible to remove this non-linearity. This may have the effect of increasing the efficiency of the device.

The actual construction of devices of the invention can, as noted above, be effected in a number of ways. Thus, the required corrugated shapes can be embossed into a compliant sheet of piezoelectric material prior to sintering, the required shape simultaneously being cut from the sheet using the same press tool. The devices can then be cured and sintered in appropriately shaped saggers to maintain the shape. After sintering, the electrodes can be applied either by printing or plating (or a combination of the two). The printing allows the electrodes to be applied on certain places to delineate the different regions of the device that must deform different. The entire device can then be poled in the same manner, so that each region would need to be activated separately.

Alternatively, the corrugations can be cut (sawn) into a flat sheet of piezoelectric material that has already been sintered (and possibly poled). The sawing process creates the required regions above and below the neutral axis of the cross-sections. The geometries produced then have squared corrugations similar to those shown in FIG. 4, but would of course still operate in the same fashion as those with rounded corrugations. It may be easier to manufacture certain geometries with this approach, since there will be fewer problems with sintering a thicker flat plate than a curved thin sheet. In low volumes, this approach will also reduce the manufacturing cost, since the costs of custom tooling will be reduced.

One of the main manufacturing issues associated with corrugated structure devices of the invention is the need for a number of different electrical connections to be made to the device, since there are different regions that must deform differently. One solution to this problem is to connect to the different regions temporarily during poling, so that all the regions of the device can be connected together and be activated with the same voltage during use. This process may require two electrode printing processes; the second one to join up all the regions after poling.

The invention claimed is:

1. A piezoelectric device the body of which is a single layer of piezoelectric material shaped so as to have a multiplicity of separate, distinct piezoelectric portions disposed in two generally planar groups that extend along, one on each side of, a nominal median plane through the whole body, which groups are thus spatially separated by and face each other across that median plane, with the result that any piezoelectric portion dimension change in the group on one side of the median plane will tend to bend the device normal to the median plane in the opposite direction to the same-sense piezoelectric portion dimension change in the group on the other side of that median plane, wherein the body is shaped as a ring, part ring or annulus, or as a disk, and the shape is corrugated such that the corrugations are straight across the body, and thus generally radial, or are at some angle to the theoretical radii, and are either straight or alternatively slightly curved into arcs.

2. A piezoelectric device that is a generally planar single-layer arcuate strip-like body having overall a broken annular shape, the body being physically shaped in a direction along its arcuate length so as to have corrugations extending across the strip, these corrugations forming separate, distinct piezo-electric-portion groups extending along and on each side of a nominal median plane through the whole body, which groups are thus spatially separated by and face each other across that median plane, with the result that any piezoelectric portion dimension change in the group on one side of the median plane will tend to bend the strip normal to the median plane across its length in the opposite direction to the same sense piezoelectric portion dimension change in the group on the other side of that median plane.

3. A device as claimed in claim 2, wherein the corrugations are disposed evenly and symmetrically about a centre line normal to the median plane.

4. A device as claimed in claim 2, wherein the median plane is co-planar with the device's neutral axis plane.

5. A device as claimed in claim 2, wherein the corrugations are not parallel and the pitch of the corrugations is relatively small compared to the smallest in-plane dimension of the device.

6. A multiplicity of devices as claimed in claim 2 formed into a stack.

7. A device as claimed in claim 1, wherein the corrugations are disposed evenly and symmetrically about a centre line normal to the median plane.

8. A device as claimed in claim 1, wherein the median plane is co-planar with a neutral axis plane of the device.

9. A device as claimed in claim 1, wherein the corrugations are not parallel and the pitch of the corrugations is relatively small compared to the smallest in-plane dimension of the device.

10. A multiplicity of devices as claimed in claim 1, formed into a stack.

11. A method of operating a piezoelectric device the body of which is a single layer of piezoelectric material shaped so as to have a multiplicity of separate, distinct piezoelectric portions disposed in two generally planar groups that extend along, one on each side of, a nominal median plane through the whole body, which groups are thus spatially separated by and face each other across that median plane, the method comprising activating the group of portions on one side of the median plane and the group of portions on the opposite side of the median plane to undergo a change in dimensions which is in an opposite sense for the two groups of portions, without clamping the device along the direction in which the portions extend, so that the piezoelectric device bends normal to the median plane along the direction in which the portions extend.

12. A method as claimed in claim 11, the overall shape of which is that of an elongate body shaped in a direction across the length of the elongate body so as to have said separate, distinct piezoelectric-portion groups extending along the body.

13. A method as claimed in claim 11, wherein the piezoelectric material is a ceramic material.

14. A method as claimed in claim 11, wherein the body of the single layer is a corrugated sheet.

15. A method as claimed in claim 14, wherein the corrugated sheet is generally planar.

16. A method as claim in claim 14, wherein the corrugated sheet is uniformly corrugated along its entire length.

17. A method as claimed in claim 14, wherein the shape of the corrugations is either sinusoidal or semicircular.

18. A method as claimed in claim 14, wherein the corrugations are reversed halfway along the body.

19. A method as claimed in claim 11, wherein the body is shaped as a ring, part ring or annulus, or as a disk, and the shape is corrugated such that the corrugations are straight across the body, and thus generally radial, or are at some angle to the theoretical radii, and are either straight or alternatively slightly curved into arcs.

\* \* \* \* \*